United States Statutory Invention Registration [19]

[11] Reg. Number: H821

Hatfield et al. [43] Published: Sep. 4, 1990

[54] MEANS AND METHOD FOR PERFORMING SHIELDING EFFECTIVENESS MEASUREMENTS USING MODE-STIRRED CHAMBERS

[75] Inventors: Michael O. Hatfield, Fredericksburg; Lawrence C. Halley, Jr., Zacata, both of Va.

[73] Assignee: The United States of America as represented by the Secretary of the Navy, Washington, D.C.

[21] Appl. No.: 499,747

[22] Filed: Mar. 27, 1990

[51] Int. Cl.[5] ..... G01R 27/00

[52] U.S. Cl. ..... 324/627

[56] References Cited

U.S. PATENT DOCUMENTS

| | | |
|---|---|---|
| 3,581,190 | 5/1971 | Brown . |
| 3,946,308 | 3/1976 | Miura et al. . |
| 4,277,741 | 7/1981 | Faxvog et al. . |
| 4,530,024 | 7/1985 | Brady, Jr. . |
| 4,733,165 | 3/1988 | Richardson et al. . |
| 4,829,233 | 5/1989 | Flemming et al. . |
| 4,841,223 | 6/1989 | Baum et al. . |

*Primary Examiner*—Thomas H. Tarcza
*Assistant Examiner*—Linda J. Wallace
*Attorney, Agent, or Firm*—John D. Lewis; Kenneth E. Walden

[57] ABSTRACT

A method of determining radiated shielding effectiveness for a piece of equipment under test (EUT) utilizing a mode-stirred chamber. Radio frequency (rf) fields are transmitted from a broad band noise source into the mode-stirred chamber. A first paddle wheel tuner uniformly distributes the rf fields throughout the chamber. The EUT is housed in the chamber such that it is exposed to the transmitted rf fields. A second paddle wheel tuner and receiving antenna are mounted within the EUT to isolate them from the transmitted rf fields. The second paddle wheel uniformly distributes any rf fields that leak into the EUT and the receiving antenna is used to detect the rf leakage.

6 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

* DISCRETE FREQUENCY DATA (25 MHz STEPS)
NOISE DATA
200
SHIELDING (dB)
100
90
80
70
60
50
40
30
20
10
0
2.7
2.8
2.9
3.0
3.1
3.2
3.3
FREQUENCY GHz

MEANS AND METHOD FOR PERFORMING SHIELDING EFFECTIVENESS MEASUREMENTS USING MODE-STIRRED CHAMBERS

ORIGIN OF THE INVENTION

The invention described herein was made in the performance of official duties by an employee of the Department of the Navy and may be manufactured, used, licensed by or for the Government for any governmental purpose without payment of any royalties thereon.

BACKGROUND OF THE INVENTION

1. Field of the Invention

This invention relates to performing radiated shielding effectiveness measurements and in particular to a means and method of performing radiated shielding effectiveness measurements using mode-stirred chambers.

2. Description of the Prior Art

A mode-stirred chamber is a modified shielded room that can range in size from small metal enclosures, e.g., a 2 cubic meter box, to large shielded rooms. To qualify for use as a mode-stirred chamber an enclosure must be a conductive, radio frequency(rf)-tight enclosure. The enclosure's smallest dimension must be large compared to the operating wavelength. This size-frequency relationship imposes a lower frequency limitation which generally restricts operations to frequencies higher than 200 MHz for most shielded rooms.

The unique feature of a mode-stirred chamber is the "paddle wheel" tuner, a relatively large field-perturbing device shaped like a paddle wheel that is rotated within the chamber. This irregularly shaped metal structure causes very large changes in the standing-wave patterns within the chamber as it rotates. In this way, the many simultaneously existing modes are "stirred" just as in the "Evaluation and Use of a Reverberation Chamber for Performing Electromagnetic Susceptibility Vulnerability Measurements" by M. L. Crawford and G. H. Koepke in the National Bureau of Standards Technical Note 1092, April 1986.

Shielding effectiveness methods using the mode-stirred chamber have proven to be easy to perform and repeatable. The traditional approach, referred to as the discrete frequency method, involves testing one frequency at a time. Energy is concentrated at discrete frequencies thereby yielding extremely accurate data. However, testing time for each frequency may take as long as forty minutes per frequency. If for example, the frequencies to be tested ranged from 2 to 4 GHz and measurements were made every 250 MHz, the total time for the test would be 360 minutes. Moreover, only nine discrete frequencies would be tested over the desired operating range.

SUMMARY OF INVENTION

Accordingly, it is an object of the present invention to provide a means and method of performing radiated shielding effectiveness measurements using mode-stirred chambers that are faster than the traditional discrete frequency method.

It is a further object of the present invention to provide a means and method of performing accurate radiated shielding effectiveness measurements over a broad band of frequencies.

Other objects and advantages of this invention will become apparent hereinafter in the specification and drawings.

In accordance with the method of the present invention, radio frequency fields are transmitted from a broad-band noise source into a mode-stirred chamber through a transmitting antenna. A first paddle wheel tuner is mounted within the chamber and slowly rotates to distribute the radio frequency fields uniformly within the chamber. A piece of equipment under test (EUT) is housed within the chamber and is exposed to the uniformly distributed radio frequency fields. A second paddle wheel tuner and receiving antenna are mounted within the EUT. The second paddle wheel rotates to distribute the radio frequency fields leaking into the EUT and the receiving antenna is used to detect the amplitude of any radio frequency field leakage. The detected fields serve as an indication of the shielding effectiveness of the EUT.

DETAILED DESCRIPTION OF THE INVENTION

Figure 1:
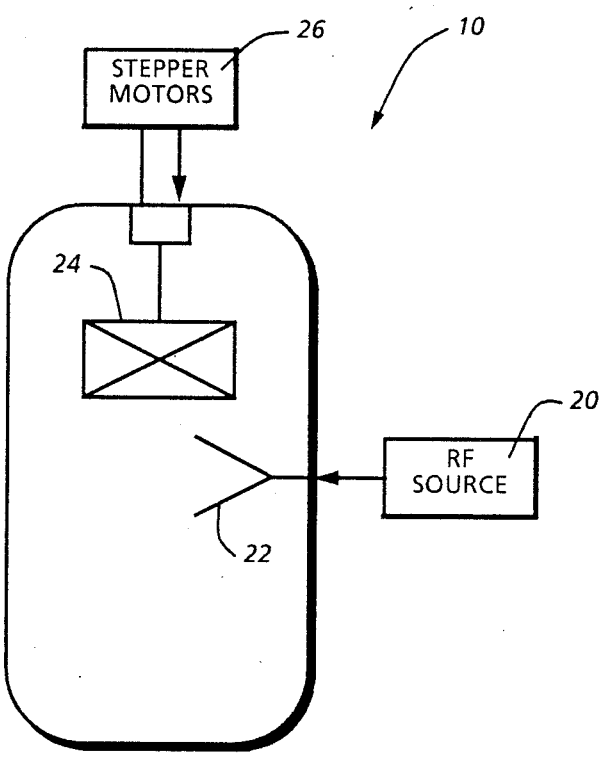
FIG. 1 is a schematic representation of a mode-stirred chamber.

A mode-stirred chamber 10, shown schematically in FIG. 1, is a radio frequency tight enclosure.. Radio frequency (rf) fields in the chamber 10 are generated by means of a rf source 20 connected to a transmitting antenna 22 mounted inside the chamber 10. Traditionally, rf source 20 transmits one discrete frequency at a time to antenna 22. Log-periodic antennas are generally used for transmitting frequencies from 200 MHz to 1 GHz and rectangular horn antennas are generally used from 1–18 GHz. The chamber 10 is equipped with a field-perturbing device or paddle wheel 24. The paddle wheel 24, shown schematically in FIG. 1, is an irregularly shaped, reflecting surface generally suspended from the chamber ceiling. Fields inside the chamber 10 are "stirred" as the paddle wheel 24 rotates. Stepper motors 26 rotate paddle wheel 24 in stepped increments as small as 0.1125 degrees (3200 steps per revolution). The dwell time between steps can be adjusted from milliseconds to hours. Analog motion can be approximated by selecting small paddle wheel steps with a short dwell time between steps.

Shielding effectiveness measurements using the mode-stirred chamber arrangement of the present invention can be made on materials, gaskets, or enclosures. Testing any of these items utilizes a nested chamber approach, that is a mode-stirred chamber within a mode-stirred chamber. For instance, if the EUT is an enclosure, a receiving antenna and a second or internal paddle wheel are installed inside the EUT, thereby turning the EUT into a small mode-stirred chamber. The internal paddle wheel insures that any rf energy that leaks into the EUT will be detected by the receiving antenna. Alternatively, if the EUT is a material sample or gasket, an rf-tight test fixture serves as the small mode-stirred chamber in which the internal paddle wheel and receiving antenna can be installed. Thus, the test fixture serves as an extension of the EUT for testing purposes.

Figure 2:
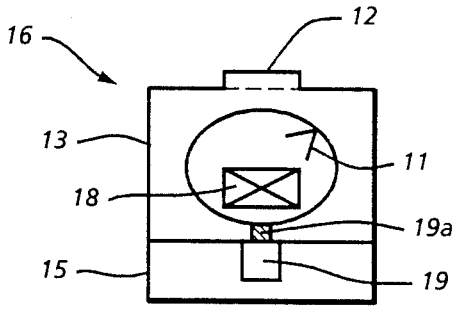
FIG. 2 is a schematic representation of the mode-stirred chamber arrangement used to perform the noise method of measuring shielding effectiveness according to the present invention.

For purposes of description only, the EUT tested by the present invention is a material sample requiring a test fixture. However, the method of the present invention is the same if the EUT is an enclosure since the EUT/test fixture is the equivalent of the EUT as an enclosure. A schematic representation of the mode-stirred chamber arrangement used to perform the method of measuring shielding effectiveness according to the present invention is shown in FIG. 2. A test fixture 16 is mounted on a block of material 14, such as styrofoam, that will not absorb or reflect rf energy. The test fixture 16 houses an internal paddle wheel 18 driven by a small DC motor 19 which in turn is powered by an independent variable DC power supply 17. The internal paddle wheel 18 is rotated at a constant speed thereby stirring any fields inside the test fixture 16. The speed at which the internal paddle wheel 18 is rotated is adjusted to insure that the monitoring equipment has time to respond to any leakage into the test fixture 16. The external paddle wheel 24 is rotated through 360 degrees in at least 200 or more steps per revolution as controlled by stepper motor control 25. The time interval between steps of the external paddle wheel 24 must be greater than or equal to the time required for the internal paddle wheel 18 to make one complete revolution. Monitoring the position of the paddle wheel 24 is accomplished by means of a synchro motor 27 attached to the rear of the motor output shaft 28. The synchro motor 27 is connected to a synchro-to-digital converter 29 which converts the signal sent by the synchro motor 27 to an angular position which corresponds to the position of the paddle wheel 24. In normal operation, the paddle wheel 24 is brought to the "zero" position of the synchro motor 27 prior to starting a measurement sequence.

Figure 3:
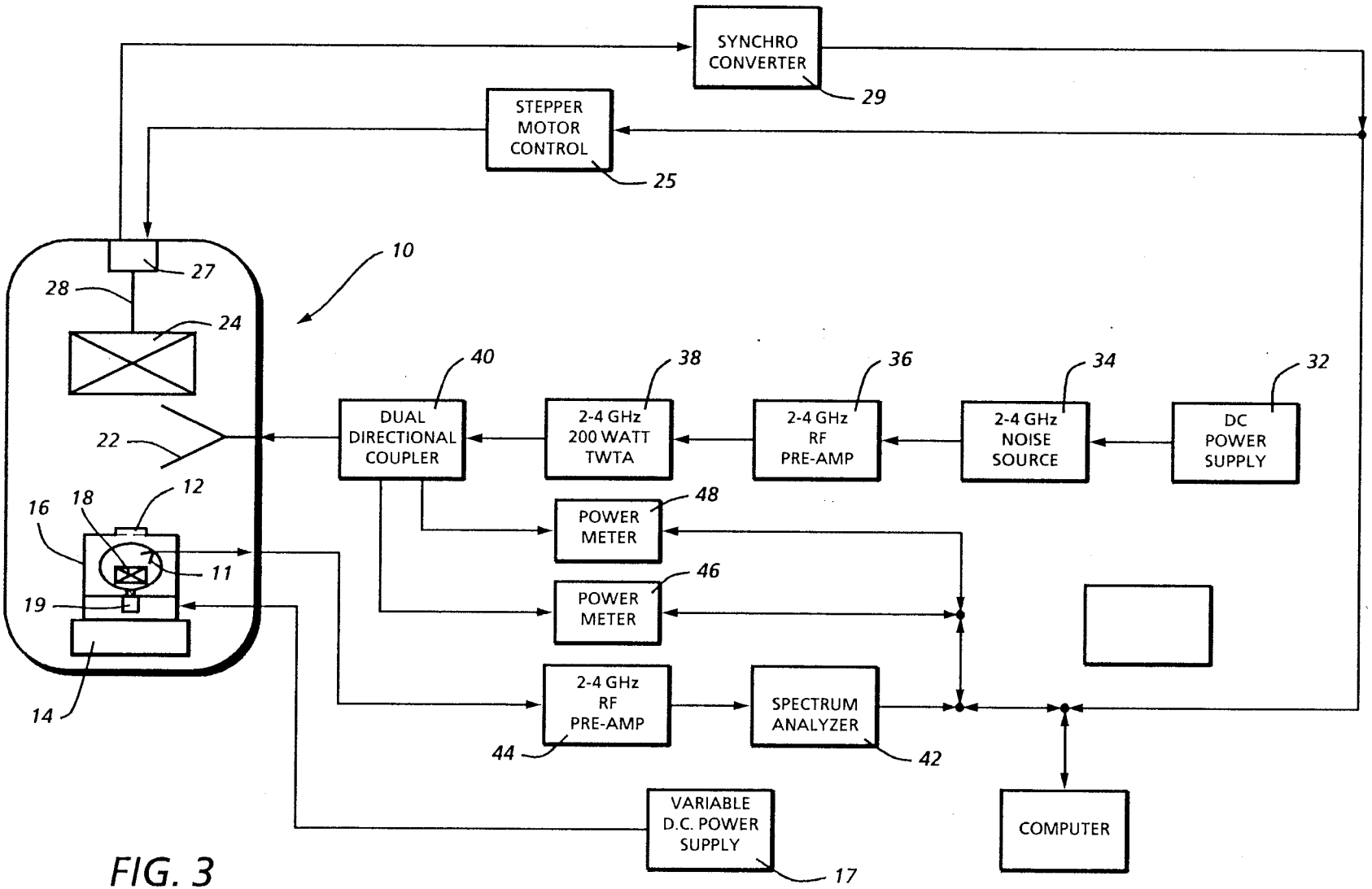
FIG. 3 is a schematic representation of the test fixture placed within the mode-stirred chamber.

The test fixture 16, shown in more detail in FIG. 3, is sectioned into two compartments 13 and 15 to provide isolation between the receiving antenna 11, which is mounted in the large upper compartment 13, and the DC motor 19 which is mounted in the lower compartment 15. The drive shaft 19*a* of the DC motor 19 protrudes into the upper compartment 13 to which the internal paddle wheel 18 is mounted. An opening in the top of the test fixture 16 serves as an aperture (indicated by the dashed lines in FIG. 2) over which the EUT 12 can be mounted.

The following three measurements are made to determine and insure valid shielding effectiveness of any EUT.

1. Base-line data: This is data taken with essentially no shielding of the receiving antenna 11. When test fixtures are required, base-line data is collected with the EUT 12 removed from the test fixture 16. When the EUT is an enclosure, base-line data is collected with doors, access hatches, etc. removed.

2. Shielding data: This is data taken with the internal paddle wheel 18 and receiving antenna 11 installed inside the EUT or EUT/test fixture. The EUT or EUT/test fixture is configured as nearly as possible for actual use. The difference between the shielding data and the baseline data is the shielding effectiveness. Shielding effectiveness is measured in decibels.

3. Dynamic range data: This is data taken merely to establish the maximum measurement range of the test setup. Expected leakage paths into the test fixture 16 through the EUT 12 are sealed up by wrapping suspected areas with conductive foil, by taping joints with conductive tape, etc. Conductive foil (not shown) is placed over the EUT 12 and taped in place with conductive tape. Care must be taken to apply the foil and tape only to the EUT 12 and not to the interface between the EUT 12 and test fixture 16 since it is the interface that is being tested for rf leakage. The difference between the dynamic range data and the baseline data should be greater than the difference between the shielding data and the baseline data. This insures that the detected signals enter through the EUT 12 and not through the test fixture 16, the interface between the EUT 12 and test fixture 16, or associated connectors, cabling, etc. An analogous situation applies when the EUT is an enclosure. In this case, it is the doors and access hatches that are covered with conductive foil and tape.

For purposes of description only, shielding effectiveness measurements taken according to the present invention will be described for the 2 to 4 GHz band. Referring again to FIG. 2, a DC power supply 32 supplies power to a solid state 2 to 4 GHz noise source 34 which is used to drive a 200 watt traveling wave tube (TWT) amplifier 38. Noise source 34 is typically an avalanche noise diode. A pre-amplifier 36 is used between noise source 34 and amplifier 38 to provide sufficient drive power for the 200 watt TWT amplifier 38. A dual directional coupler 40, in conjunction with power meters 46 and 48, is used to monitor the rf energy delivered to and reflected from the chamber 10. Also, a pre-amplifier 44 was added between the receiving antenna 11 and the spectrum analyzer 42 to amplify the received signal to a level that would permit a low sweep time setting on the spectrum analyzer 42.

Before beginning the measurement sequence, the response time of the monitoring equipment, in this case a spectrum analyzer 42, and the rotation rates of the paddle wheels 18 and 24 must be determined. The sweep time of the spectrum analyzer 42 is found by setting the spectrum analyzer 42 to the desired start and stop frequencies and adjusting the spectrum analyzer 42 to obtain the shortest possible sweep time while maintaining sufficient frequency resolution and dynamic range. In order to determine the rotation rate of the internal paddle wheel 18, the rotation rate is increased until there is a decrease in the signal detected by receiving antenna 11. In order to determine the dwell time between steps of the external paddle wheel 24, the dwell time is progressively increased until no further increase in the signal is received by antenna 11.

As previously stated, the determination of shielding effectiveness measurements according to the present invention begins with the collection of baseline data. Baseline data is obtained by placing the test fixture 16 into the chamber 10 without EUT 12 attached. The 2 to 4 GHz noise signal is then supplied to chamber 10 via transmitting antenna 22. Internal paddle wheel 18 is then continuously rotated through 360 degrees for each rotational step of external paddle wheel 24. Receiving antenna 11 and spectrum analyzer 42 monitor the rf fields that leak into the test fixture 16. The measurement sequence described above is then repeated with the EUT 12 in place in order to collect the shielding data. The baseline data is then subtracted from the shielding data resulting in a shielding effectiveness measurement.

The amount of time spent collecting data is dependent on the number of frequencies tested and the time required to rotate the external paddle wheel 24. The traditional discrete frequency approach is capable of testing only one frequency for each rotation of the external paddle wheel 24. The external paddle wheel 24 is typically rotated at 200 steps per revolution. A typical spectrum analyzer 42 used to collect the data is capable of digitizing up to 1001 points or frequencies between the assigned start and stop frequencies. Since the frequency span for the described test setup was 2000 MHz, the frequency resolution of the spectrum analyzer is approximately 2 MHz. If the dwell time between steps of the external paddle wheel 24 were 12 seconds, testing in the 2 to 4 GHz band would take approximately 40 minutes per frequency (12 seconds/step×200 steps/-revolution). Moreover, since each of the data collections (baseline, shielding and dynamic range) require one full revolution of the external paddle wheel 24, the total test time is actually 3 times as long or 120 minutes per frequency. In contrast, the means and method presented by the present invention produces shielding effectiveness measurements across the entire 2 to 4 GHz band in one complete revolution of the external paddle wheel 24. Thus, the total test time for all frequencies in the 2 to 4 GHz band is only 120 minutes. This is considerably faster than the prior art testing schemes.

Figure 4:
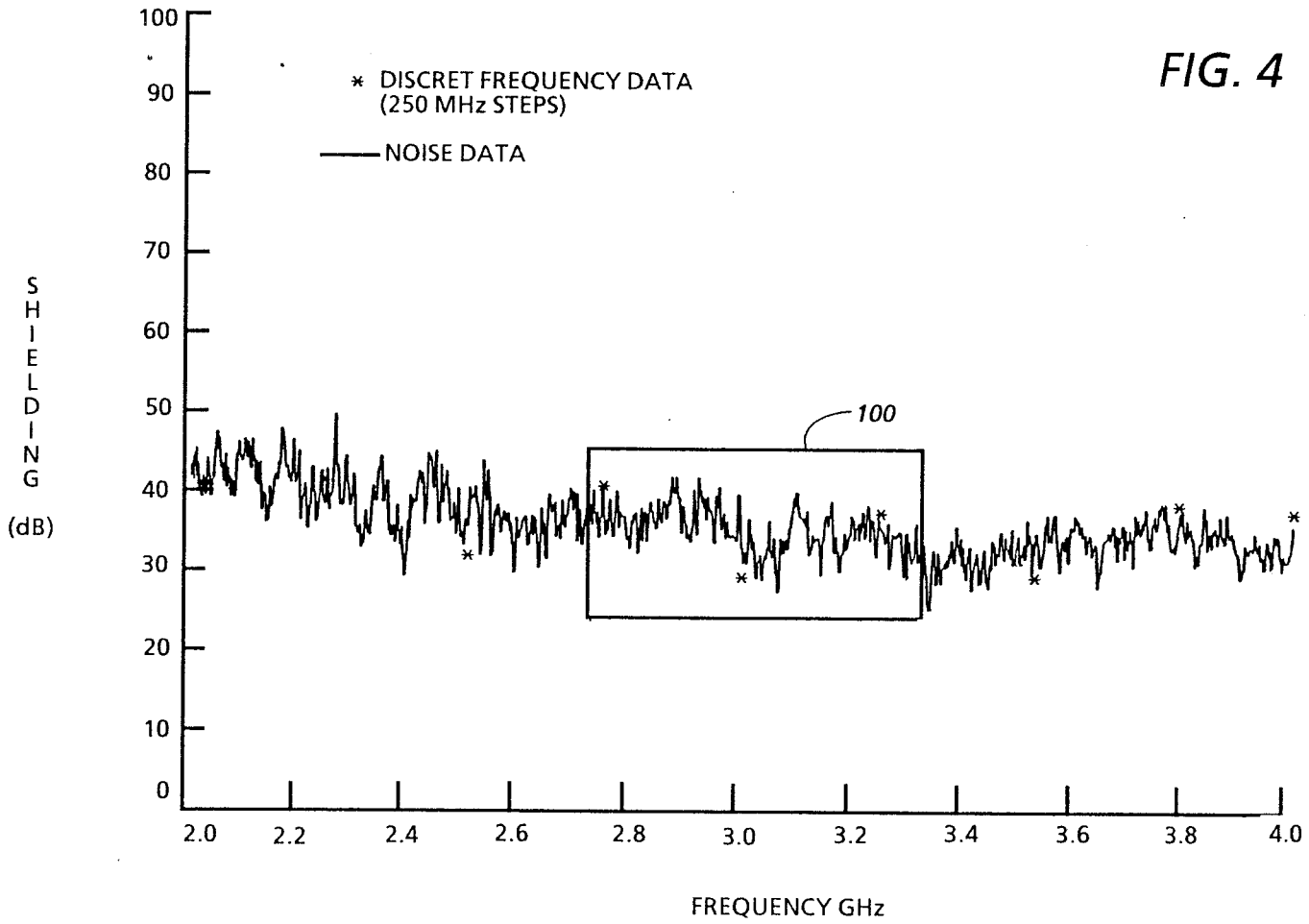
FIG. 4 is a graph of shielding effectiveness measurements obtained by the traditional discrete frequency method and by the noise method of the present invention.
Figure 5:
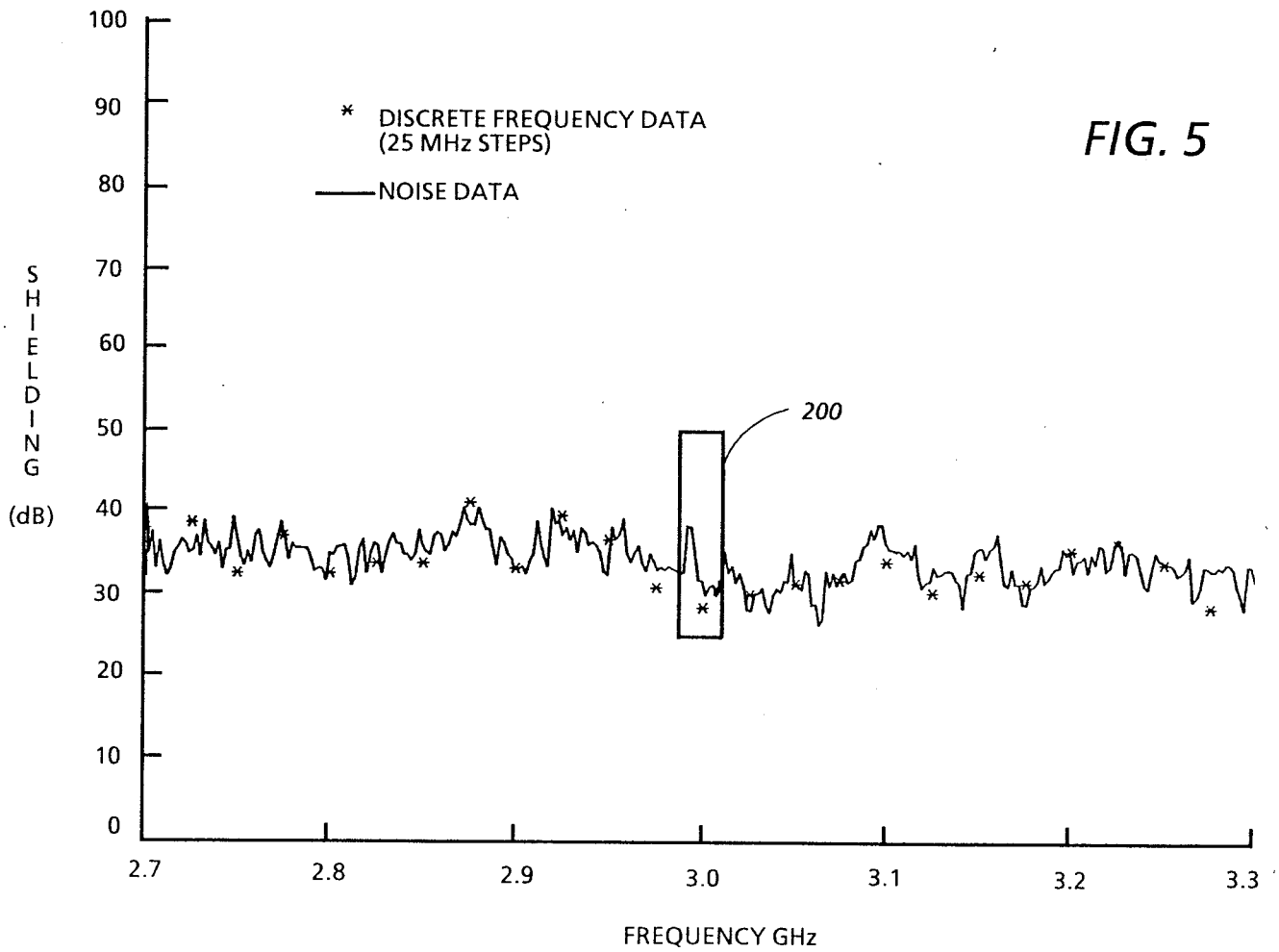
FIG. 5 is a graph of the windowed portion of FIG. 4.
Figure 6:
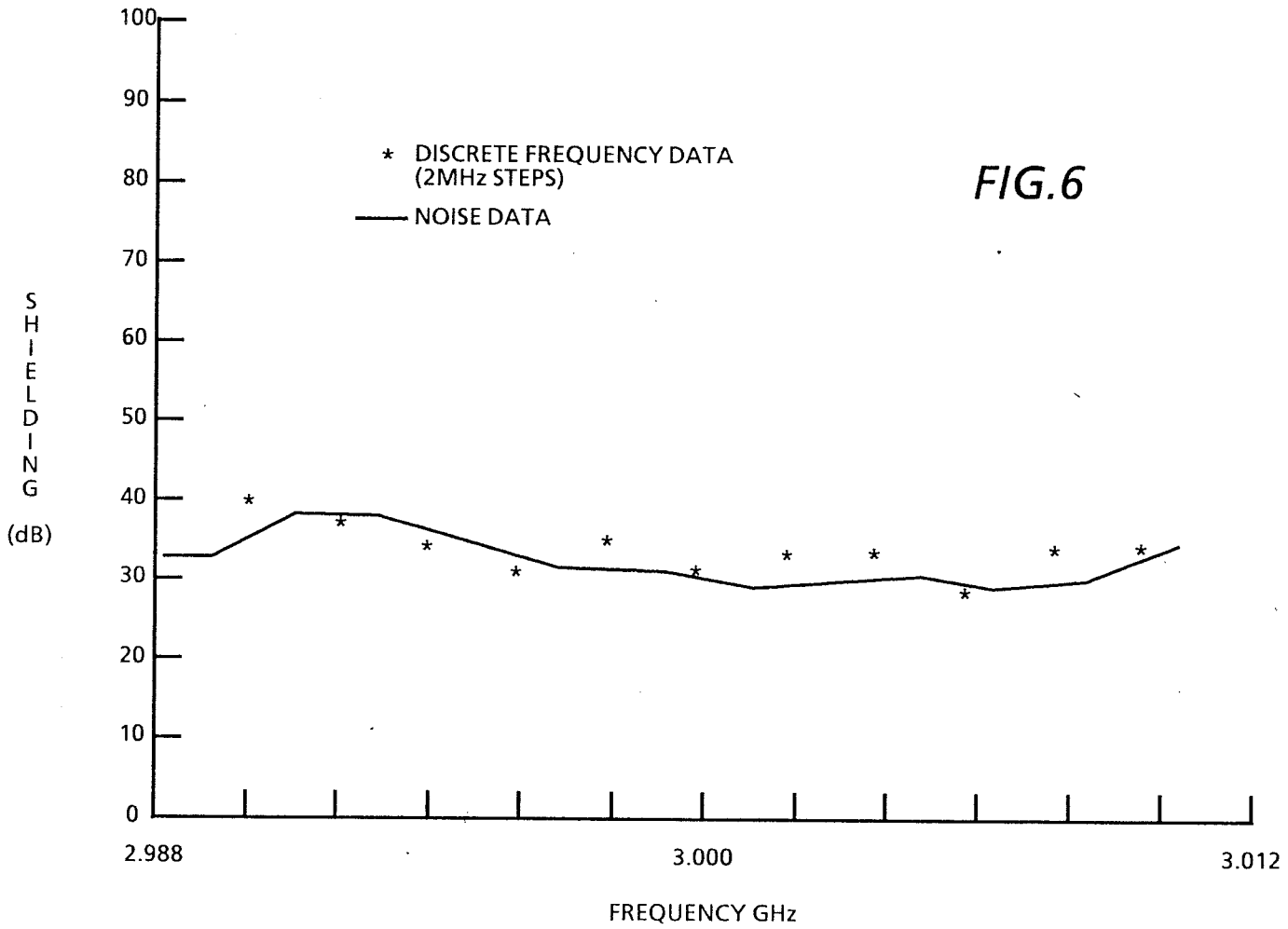
FIG. 6 is a graph of the windowed portion of FIG. 5.

Furthermore, the results of the noise method of the present invention show a great deal of fine structure not revealed by discrete frequency testing. FIG. 4 shows the shielding results of the noise method and the discrete frequency data plotted at 250 MHz intervals. An examination of the area 100 windowed in FIG. 4 is shown in FIG. 5. The discrete frequency data measurements shown in FIG. 5 are spaced at 25 MHz intervals. The agreement between the noise data and the discrete data is quite good; however, there is still a great deal of detail between the discrete frequency measurement points which may be examined. FIG. 6 shows an expanded view of the area 200 windowed in FIG. 5. The discrete frequency data measurement shown in FIG. 6 are spaced at 2 MHz intervals. From this it can be seen that the noise data windowed in FIG. 5 closely approximates the discrete frequency data and shows fine detail not revealed by the discrete frequency data.

The advantages of the present invention are numerous. The noise method can test all frequencies in the test range in the time that it takes the discrete frequency method to test one discrete frequency. The use of the relatively inexpensive noise sources and low-power broad-band amplifiers offer a fast, economical and repeatable method of performing radiated shielding effectiveness measurements over large frequency spans in short periods of time. The equipment used to collect the measurements can vary from high-power amplifiers and complex spectrum analyzers to low-power solid state amplifiers and power meters. Frequency spans of many types of equipment can be optimized for collecting data over specific areas of interest thereby increasing the dynamic range of the measurement setup at a minimum cost.

Thus, although the invention has been described relative to specific embodiments thereof, it is not so limited and numerous variations and modifications thereof will be readily apparent to those skilled in the art in light of the above teaching. It is therefore to be understood that within the scope of the appended claims, the invention may be practiced otherwise than as specifically described.

What is claimed is:

1. A method of determining shielding data for a piece of equipment under test (EUT) using a mode-stirred chamber comprising the steps of:

a. transmitting radio frequency fields across a continuous spectrum of test frequencies from a radio frequency noise source into said chamber;

b. distributing said radio frequency fields uniformly within said chamber;

c. exposing said EUT to said uniformly distributed fields within said chamber; and d. detecting the amplitude of said transmitted radio frequency fields leaking into said EUT.

2. A method according to claim 1 wherein said step of distributing comprises the step of rotating a first paddle wheel mounted within said mode-stirred chamber.

3. A method according to claim 2 wherein said step of detecting comprises the steps of:

a. isolating a receiving means, mounted within said EUT, from said transmitted radio frequency fields; and b. uniformly distributing said radio frequency fields leaking into said EUT.

4. A method according to claim 3 wherein said step of uniformly distributing said radio frequency fields leaking into said EUT comprises the step of rotating a second paddle wheel mounted within said EUT.

5. A method according to claim 4 wherein said first paddle wheel is rotated in incremental steps and wherein said second paddle wheel is rotated continuously.

6. A method according to claim 5 wherein said second paddle wheel rotates 360 degrees for each incremental step of said first paddle wheel.

* * * * *